(12) United States Patent
Huang

(10) Patent No.: US 10,448,737 B2
(45) Date of Patent: Oct. 22, 2019

(54) LOCKING DEVICE AND ENCLOSURE USING THE SAME

(71) Applicants:HONG FU JIN PRECISION INDUSTRY (WuHan) CO., LTD., Wuhan (CN); HON HAI PRECISION INDUSTRY CO., LTD., New Taipei (TW)

(72) Inventor: Fu-Kuo Huang, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 337 days.

(21) Appl. No.: 15/391,808

(22) Filed: Dec. 27, 2016

(65) Prior Publication Data

US 2018/0135340 A1 May 17, 2018

(30) Foreign Application Priority Data

Nov. 11, 2016 (CN) .......................... 2016 1 0996821

(51) Int. Cl.
*H05K 5/02* (2006.01)
*H05K 7/14* (2006.01)
*A47B 88/00* (2017.01)
*E05C 9/04* (2006.01)

(52) U.S. Cl.
CPC .......... *A47B 88/00* (2013.01); *H05K 5/0221* (2013.01); *H05K 7/1421* (2013.01); *E05C 9/04* (2013.01); *Y10T 292/0823* (2015.04); *Y10T 292/0993* (2015.04); *Y10T 292/307* (2015.04)

(58) Field of Classification Search
CPC . E05C 9/04; E05C 9/041; E05C 9/042; Y10T 292/03; Y10T 292/0993; Y10T 292/307; Y10T 292/0823; Y10T 292/0824; Y10T 292/14; Y10T 292/0843; Y10T 292/57; Y10T 292/0894; Y10T 292/0969; Y10S 292/53; Y10S 292/54
See application file for complete search history.

(56) References Cited

U.S. PATENT DOCUMENTS

| 607,260 | A | * | 7/1898 | Morse | ................... E05B 67/383 292/151 |
| 687,006 | A | * | 11/1901 | Fister | ...................... E05B 85/22 292/172 |
| 702,198 | A | * | 6/1902 | Gibboney | ............... E05B 63/20 292/279 |

(Continued)

FOREIGN PATENT DOCUMENTS

EP 1099810 * 5/2001

*Primary Examiner* — Carlos Lugo
(74) *Attorney, Agent, or Firm* — ScienBiziP, P.C.

(57) ABSTRACT

A locking device includes a first side plate and a first driven screw. The first side plate includes a first moving track with a first driving member extending along the first moving track and a first driven screw includes a first threaded rod; and a first follower mounted to an end of the first threaded rod and coupling with the first driving member. When the first driven screw moves along the first moving track, the first follower is driven to rotate by the first driving member, thereby driving the first threaded rod to rotate along a locking direction or an unlocking direction. An enclosure is further disclosed.

12 Claims, 4 Drawing Sheets

(56) References Cited

U.S. PATENT DOCUMENTS

| | | | | |
|---|---|---|---|---|
| 1,102,313 | A * | 7/1914 | Yates et al. | E05B 85/22 292/172 |
| 1,183,490 | A * | 5/1916 | Pollgreen | B65D 39/084 220/214 |
| 2,431,105 | A * | 11/1947 | Brinson | E05C 1/14 292/172 |
| 2,673,109 | A * | 3/1954 | Frost | E05C 1/16 292/150 |
| 4,058,333 | A * | 11/1977 | Roe | E05B 63/06 292/142 |
| 4,335,816 | A * | 6/1982 | Rager | E05B 5/00 206/1.5 |
| 4,476,700 | A * | 10/1984 | King | E05C 9/041 292/39 |
| 4,674,781 | A * | 6/1987 | Reece | E05B 81/25 292/201 |
| 4,834,433 | A * | 5/1989 | Keller | E05B 85/18 16/DIG. 24 |
| 5,292,159 | A * | 3/1994 | Sandhu | E05B 15/1635 292/173 |
| 5,390,761 | A * | 2/1995 | Perry | E04G 1/20 182/118 |
| 5,531,493 | A * | 7/1996 | Reynolds | A47D 1/08 292/160 |
| 5,826,922 | A * | 10/1998 | Wernig | E05C 9/041 292/39 |
| 6,152,501 | A * | 11/2000 | Magi | E05B 5/00 292/169 |
| 6,598,909 | B2 * | 7/2003 | Lu | E05B 47/0012 292/144 |
| 7,011,347 | B2 * | 3/2006 | Finardi | E05B 65/0021 160/201 |
| 7,819,445 | B2 * | 10/2010 | Najima | B60R 5/04 292/143 |
| 8,733,815 | B2 * | 5/2014 | Kwon | E05B 81/06 292/336.3 |
| 2014/0265360 | A1 * | 9/2014 | Or Haim | E05C 9/008 292/160 |

\* cited by examiner

LOCKING DEVICE AND ENCLOSURE USING THE SAME

FIELD

The subject matter herein generally relates to a locking device and enclosure using the locking device.

BACKGROUND

An electronic device generally includes an enclosure and a plurality of plug-in members mounted in the enclosure. Each plug-in member is mounted to the enclosure with a plurality of screws.

BRIEF DESCRIPTION OF THE DRAWINGS

Implementations of the present technology will now be described, by way of example only, with reference to the attached figures.

DETAILED DESCRIPTION

Figure 1:
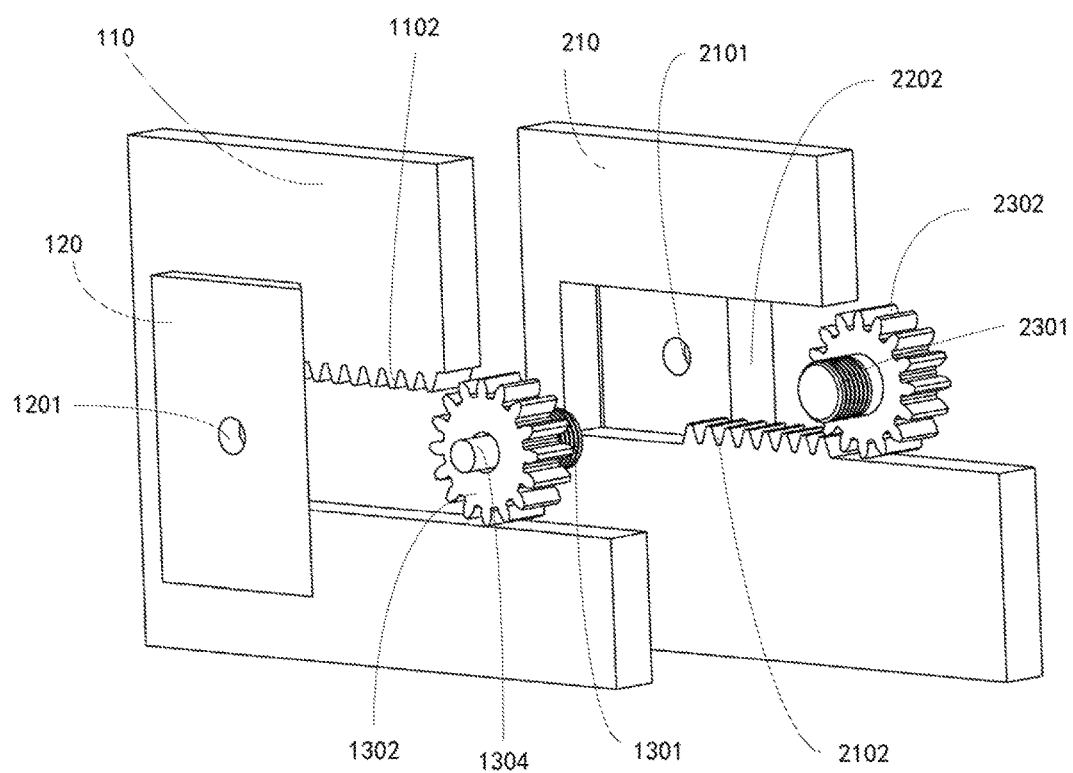
FIG. 1 is an isometric view of an exemplary embodiment of a locking device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
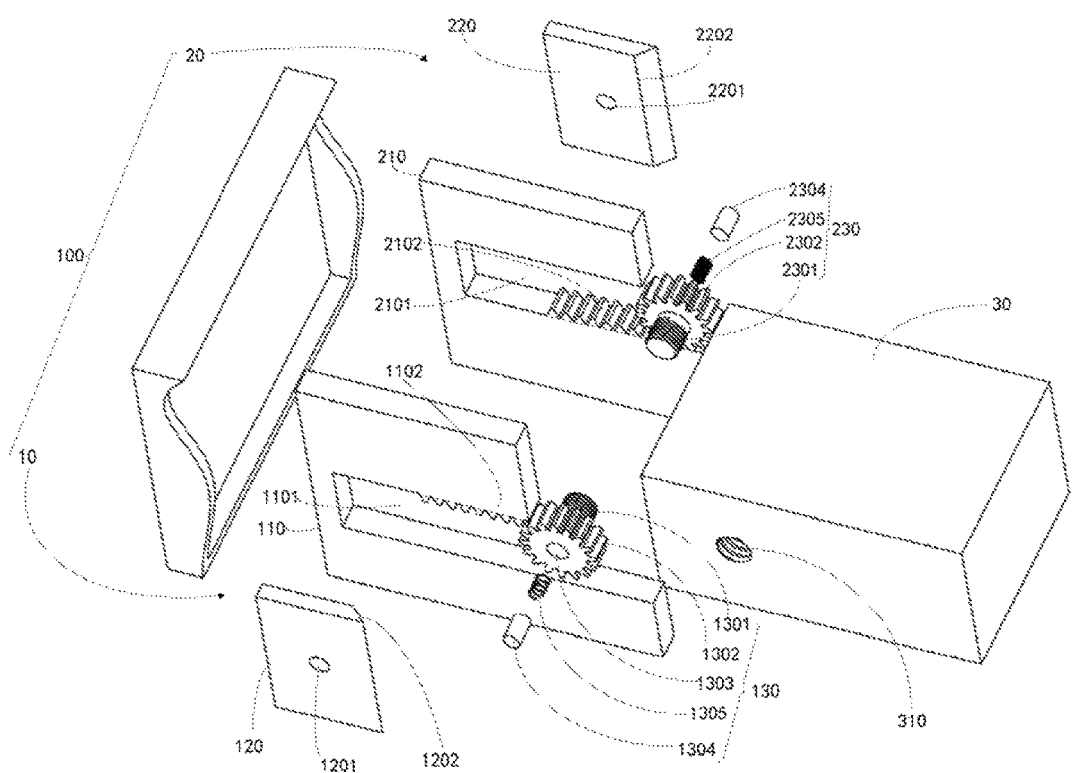
FIG. 2 is an exploded view of the locking device of FIG. 1.

FIGS. 1 and 2 illustrate an enclosure 1 in an exemplary embodiment.

Figure 3:
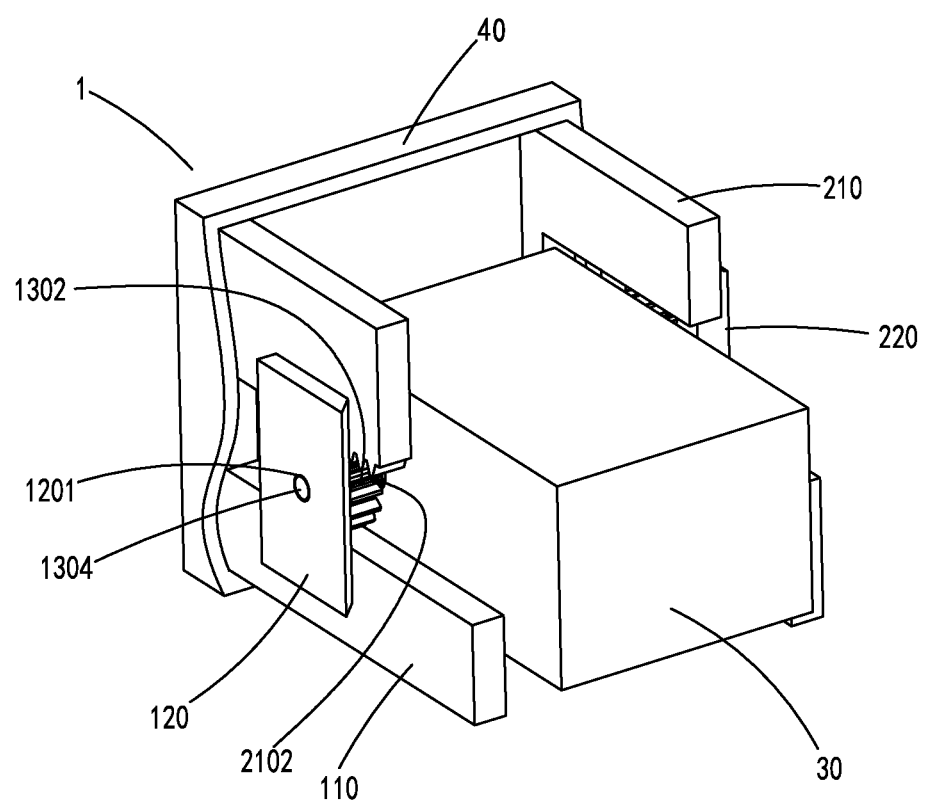
FIG. 3 is an isometric view of an enclosure applying the locking device of FIG. 1, and showing the locking device in a locking position.
Figure 4:
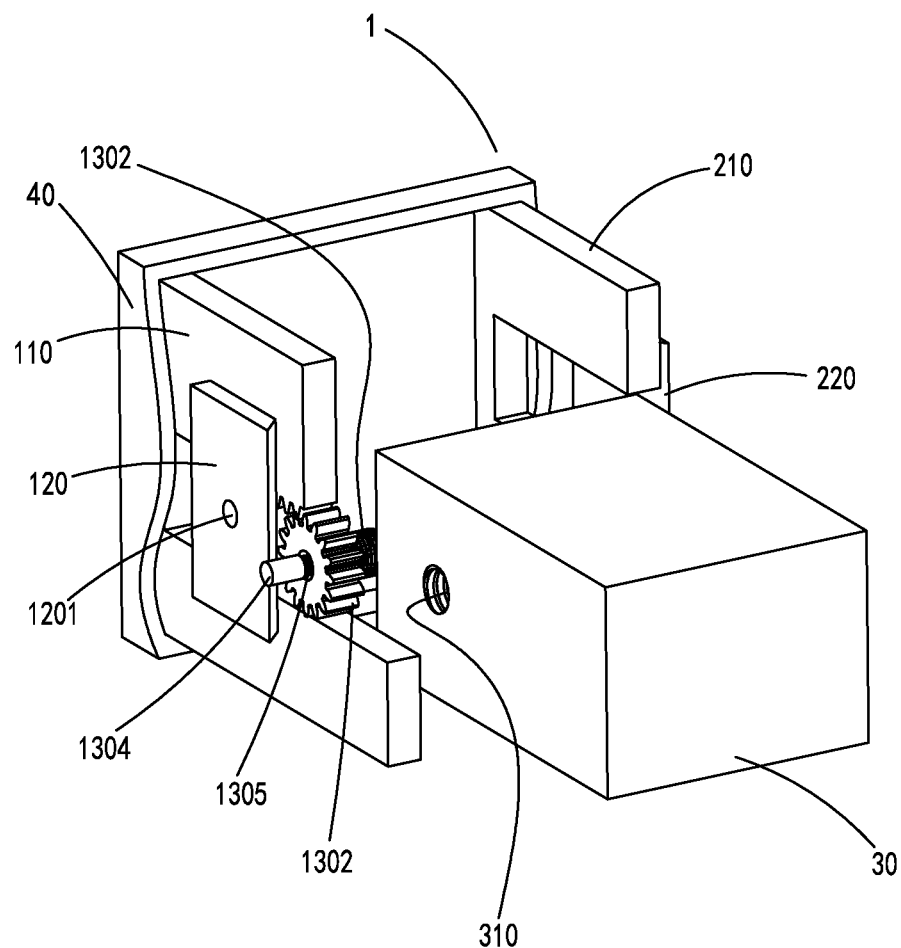
FIG. 4 is an assembled view of the enclosure of FIG. 3, and showing the locking device in an unlocking position.

The enclosure 1 can include a chassis 40 and a locking device 100 located within the chassis 40. The chassis 40 of the enclosure 1 is partially shown in FIGS. 3-4. The locking device 100 can include a first locking unit 10 and a second locking unit 20. It is understood that in other exemplary embodiments, the enclosure 1 can include the first locking unit 10 and the second locking unit 20 at the same time, or the enclosure 1 can include one of the first locking unit 10 and the second locking unit 20.

The exemplary embodiment shown is a locking device 100 including the first locking unit 10 and the second locking unit 20 at the same time. The first locking unit 10 and the second locking unit 20 are substantially symmetric with each other.

The first locking unit 10 can include a first side plate 110, a first locating plate 120, and a first driven screw 130.

The first side plate 110 defines a first moving track 1101, the first moving track 1101 can include a first rack 1102 extending along the first moving track 1101. The first rack 1102 can be a toothed bar or a toothed rail.

The first locating plate 120 can be mounted to a peripheral surface of an end of the first moving track 1101. The first locating plate 120 defines a first locating hole 1201, a profile of the first locating plate 120 is formed as a first guiding slope 1202.

The first driven screw 130 can include a first threaded rod 1301, a first gear 1302, a first pin 1304, and a first spring 1305. An end surface of the first gear 1302 is mounted to an end of the first threaded rod 1301, an opposite end surface of the first gear 1302 defines a first sink hole 1303. One end of the first pin 1304 is flexibly connected to the first sink hole 1303 through the first spring 1305.

Correspondingly, the second locking unit 20 can include a second side plate 210, a second locating plate 220 and a second driven screw 230. The second side plate 210 defines a second moving track 2101, the second moving track 2101 can include a second rack 2102 extending along the second moving track 2101. Teeth of the second rack 2102 and teeth of the first rack 1102 face towards each other, for example, when the first rack 1102 locates on an upper side of the first moving track 1101, the second rack 2201 can be located on a lower side of the second moving track 2101, so that when the first driven screw 130 and the second driven screw 230 are driven to moving along the first moving track 1101 and the second moving track 2101, the first gear 1302 and the second gear 2302 are driven to rotate along a same direction.

The second locating plate 220 can be mounted to a peripheral surface of an end of the second moving track 2101. The second locating plate 220 defines a second locating hole 2201, a profile of the second locating plate 220 is formed as a second guiding slope 2202.

The second driven screw 230 can include a second threaded rod 2301, a second gear 2302, a second pin 2304 and a second spring 2305. An end surface of the second gear 2302 is mounted to an end of the second threaded rod 2301, an opposite end surface of the second gear 2302 defines a second sink hole (not shown). One end of the second pin 2304 is flexibly connected to the second sink hole 2303 through the second spring 2305.

The locking unit 100 can be mounted in the enclosure 1 and used to lock a plug-in member 30 inserted along the first moving track 1101 and the second moving track 2101, the plug-in member 30 can define screw holes 310 coupled with the first threaded rod 1301 and the second threaded rod 2301. When the plug-in member 30 is inserted, the first threaded rod 1301 and the second threaded rod 2301 resist on the screw holes 310. When the plug-in member 30 moves along the first moving track 1101 and the second moving track 2101, the first driven screw 130 and the second driven screw 230 are moved along with the plug-in member 30, the first gear 1302 is driven to rotate by the first rack 1102, the second gear 2302 is driven to rotate by the second rack 1102, thereby drives the first driven screw 130 and the second driven screw 230 to rotate to screw in the screw holes 310.

When the first driven screw 130 moves towards the first locating hole 1201, the first pin 1304 moves towards and is resisted by the first guiding slope 1202, the first pin 1304 approaches the first sink hole 1303, the first spring 1305 is elastically deformed; when the first driven screw 130 moves to the first locating hole 1201, a free end of the first pin 1304 fits in the locating hole 1201 by restoring force of the first spring 1305 similar to the second driven screw 230 when moving towards the second locating hole 2201.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A locking device comprising:
    a first locking unit comprising:
        a first side plate defining a first moving track, the first side plate comprising a first rack located on a side of the first moving track and extending along the first moving track;
        a first driven screw comprising:
            a first threaded rod; and
            a first gear engaged with the first rack and mounted to an end of the first threaded rod and coupling with the first rack;
            a first pin flexibly connected to an end surface of the first gear; and
            a first spring, wherein the end surface of the first gear defines a first sink hole, an end of the first pin is connected to the first sink hole by the first spring; and
        a first locating plate mounted to a peripheral surface of an end of the first moving track, the first locating plate comprising a first locating hole; and
    wherein the latching member is coupled with the first locating hole of the first locating member; when the first driven screw moves along the first moving track, the first gear is driven to rotate by the first rack, thereby driving the first threaded rod to rotate along a locking direction or an unlocking direction; and when the first driven screw moves to a locking position along the locking direction, the first locating plate latches the first pin through the locating hole, and when the first pin is released from the locating hole, the first gear is capable of being driven to move along the unlocking direction to an unlocking position.

2. The locking device of claim 1, wherein a profile of the first locating plate is formed as a first guiding slope corresponding to a free end of the first pin; when the first driven screw moves towards the first locating hole, the first pin is resisted by the first guiding slope and the first pin approaches the first sink hole, and the first spring is elastically deformed; when the first driven screw moves to the first locating hole, the free end of the first pin fits in the locating hole by restoring force of the first spring.

3. The locking device of claim 1, wherein the locking device further comprising a second driven screw and a second side plate parallel with the first side plate; the second side plate comprises a second moving track, the second moving track comprising a first driving member extending along the second moving track; the second driven screw comprises a second threaded rod and a second follower, the second follower is mounted to an end of the second threaded rod and couples with the second driving member.

4. The locking device of claim 3, wherein the first driving member is a second rack located in the second moving track; the second follower is a second gear engaged with the second rack.

5. The locking device of claim 4, wherein the locking device further comprising a second locating member configured in a first end of the second moving track, the second driven screw further comprising a latching member coupled with the second locating member; when the second driven screw moves to the first end of the second moving track, the second driven screw is locked by the locating member through the second latching member.

6. The locking device of claim 5, wherein the second locating member is a second locating plate comprising a second locating hole; the second latching member is a second pin flexibly connected to an end surface of the second gear; a profile of the second locating plate is formed as a second guiding slope corresponding to a free end of the second pin.

7. An enclosure comprising:
    a chassis; and
    a locking device located within the chassis and mounted to the chassis, comprising:
        a first locking unit comprising:
            a first side plate defining a first moving track, the first side plate comprising a first rack located on a side of the first moving track and extending along the first moving track;
            a first driven screw comprising:
                a first threaded rod; and
                a first gear engaged with the first rack and mounted to an end of the first threaded rod and coupling with the first rack; and
                a first pin flexibly connected to an end surface of the first gear; and
                a first spring, wherein the end surface of the first gear defines a first sink hole, an end of the first pin is connected to the first sink hole by the first spring; and
            a first locating plate mounted to a peripheral surface of an end of the first moving track, the first locating plate comprising a first locating hole; and
        wherein the latching member is coupled with the first locating hole of the first locating member; when the first driven screw moves along the first moving track, the first gear is driven to rotate by the first rack, thereby driving the first threaded rod to rotate along a locking direction or an unlocking direction; and when the first driven screw moves to a locking position along the locking direction, the first locating plate latches the first pin through the locating hole, and when the first pin is released from the locating hole, the first gear is capable of being driven to move along the unlocking direction to an unlocking position.

8. The enclosure of claim 7, wherein a profile of the first locating plate is formed as a first guiding slope corresponding to a free end of the first pin; when the first driven screw moves towards the first locating hole, the first pin is resisted by the first guiding slope and the first pin approaches the first sink hole, and the first spring is elastically deformed; when the first driven screw moves to the first locating hole, the free end of the first pin fits in the locating hole by restoring force of the first spring.

9. The enclosure of claim 7, wherein the enclosure further comprising a second driven screw and a second side plate parallel with the first side plate; the second side plate comprises a second moving track, the second moving track comprising a first driving member extending along the second moving track; the second driven screw comprises a second threaded rod and a second follower, the second follower is mounted to an end of the second threaded rod and coupling with the second driving member.

10. The enclosure of claim 9, wherein the first driving member is a second rack located in the second moving track; the second follower is a second gear engaged with the second rack.

11. The enclosure of claim 10, wherein the enclosure further comprising a second locating member configured in a first end of the second moving track, the second driven screw further comprising a latching member coupled with the second locating member; when the second driven screw moves to the first end of the second moving track, the second driven screw is locked by the locating member through the second latching member.

12. The enclosure of claim 11, wherein the second locating member is a second locating plate comprising a second locating hole; the second latching member is a second pin flexibly connected to an end surface of the second gear; a profile of the second locating plate is formed as a second guiding slope corresponding to a free end of the second pin.

\* \* \* \* \*